(12) United States Patent
Lin

(10) Patent No.: US 8,577,655 B2
(45) Date of Patent: Nov. 5, 2013

(54) SYSTEM AND METHOD FOR CONSTRUCTING VIRTUAL NC CONTROLLERS FOR MACHINE TOOL SIMULATION

(75) Inventor: Gen Shieng Lin, La Palma, CA (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 558 days.

(21) Appl. No.: 12/491,440

(22) Filed: Jun. 25, 2009

(65) Prior Publication Data

US 2009/0326892 A1 Dec. 31, 2009

Related U.S. Application Data

(60) Provisional application No. 61/075,900, filed on Jun. 26, 2008.

(51) Int. Cl.
*G06G 7/48* (2006.01)
*G06F 17/50* (2006.01)

(52) U.S. Cl.
CPC ................... *G06F 17/5018* (2013.01)
USPC ............... 703/7; 700/181; 700/182

(58) Field of Classification Search
USPC .......... 703/7; 700/159–160, 181–183
See application file for complete search history.

(56) References Cited

U.S. PATENT DOCUMENTS 4,513,366 A * 4/1985 Munekata et al. ............ 700/178
6,671,571 B1 * 12/2003 Matsumiya et al. .......... 700/172
6,999,845 B2 * 2/2006 Hirai et al. .................... 700/189
7,761,183 B2 * 7/2010 Sullivan ........................ 700/182
7,764,039 B2 * 7/2010 Yamaguchi et al. .......... 318/569

FOREIGN PATENT DOCUMENTS

DE      102005047543 A1    4/2007

OTHER PUBLICATIONS

Altintas et al. "Virtual Machine Tool"., CIRP Annals-Manufacturing Technology., vol. 54, Issure2, 2005, pp. 115-138.*
Lee, et al.; Journal of Materials Processing Technology, Elsevier, NL, vol. 140, No. 1-3; pp. 211-216; Magazine; 2003; NL.
Schneider, Werner; pp. 300-303; Fachbuchverlag Leipzig; Others; 2001; DE.
Li, et al.; The International Journal of Advanced Manufacturing Technology, Springer, Berlin, DE, vol. 36, No. 9-10, pp. 908-917; ISSN: 1433-3015; Magazine; 2007; DE.
Yao, et al.; Computers in Industry, Elsevier Science Publishers. Amsterdam, NJ, vol. 47, No. 3, pp. 255-268; Magazine; 2002; NL.

(Continued)

*Primary Examiner* — Eunhee Kim

(57) ABSTRACT

A system, method, and computer program product for creating a virtual numerical control (NC) controller for use in machine tool simulation. A method includes receiving a NC program readable by a physical machine tool, the NC program containing instructions for manipulating the physical machine tool. The method also includes parsing the instructions in the NC program. The method further includes receiving setup data, such as tools, reference coordinates systems, etc., from objects of a CAM system or in a setup data file. The method still further includes translating each instruction in the NC program into at least one virtual NC controller command. The method also includes executing the virtual NC controller commands in a machine tool simulation environment. In some embodiments, the method may include fetching data from a post-processor for the physical machine tool, where the fetched data is not available in the NC program.

20 Claims, 15 Drawing Sheets

(56) References Cited

OTHER PUBLICATIONS

Sun, et al; Modelling, Simulation and Optimization, 2008. WMSO '08 Int'l Workshop; IEEE, Piscataway, NJ US; pp. 313-318; Others; 2008; US.

Koncewicz, D.; Prace Naukowe Instytutu Cybernetyki Technicznej Politechniki Worclawskiej, 1991, pp. 13-19; Others; 1991; PL.

Xiao, et al.; Control and Automation. ICCA; IEEE Int'l Conference, 2007, Piscataway, NJ, US, pp. 1237-1240; Others; 2007; US.

Kao, et al.; Materials Science Forum, 2006; pp. 631-636; Others; 2006; TW.

* cited by examiner

200

300

▷ A REVERSE POST INTERCEPTS NC CODE BLOCKS, THEN DISSECTS AND INTERPRETS THEM INTO MACHINE TOOL MOVEMENTS.

400

```
%
N0010 G40 G17 G90 G70
N0020 G91 G28 Z0.0
:0030 T04 M06
N0040 G54
N0050 G00 G90 X10.431 Y3.249 B0.0 S0 M03
N0060 G43 Z1.578 H04
N0070 Z1.478
N0080 G01 Z1.378 F10. M08
N0090 X10.331
N0100 X7.976
N0110 G00 X7.876 Y4.109
N0120 Z1.478
N0130 Z1.83
N0140 X10.431 Y3.837
N0150 Z1.578
N0160 Z1.478
N0170 G01 Z1.378
N0190 X10.331
```

For Help,press F1       CAP

FIG. 5A

1. ABSOLUTE OR INCREMENTAL MODE - G90/91.

2. INPUT UNIT-G70/G71 OR G20/G21.

3. REFERENCE COORDINATE SYSTEM-G28/G29/G30, G52/G53/G54~G59 & G92.

4. MOTION TYPE-G00/G01/G02/G03/G81.

5. PLANE CODE (FOR CIRCLES & DRILLING CYCLES)-G17/G18/G19.

6. COORDINATES-X, Y, Z, A, B, I, J, K, R, S & F.

FIG. 5B

▷ OTHER BASIC NC INSTRUCTIONS ARE ALSO IDENTIFIED AND PROCESSED FOR SIMULATION

1. OPTIONAL SKIP (OPSKIP) BLOCK    -/N0010 M00

2. CONTROLLER VARIABLES    -N0020 #12=34.5

3. TOOL CHANGE    -M06

4. PROGRAM STOP    -M00/M30

5. FEEDRATE UNIT    -G98/G99/G93

6. SPINDLE SPEED UNIT    -G96/G97

7. SPINDLE DIRECTION    -M13/M14/M05

8. COOLANT MODE    -M07/M08/M09

9. PROGRAM REWIND STOP CODE    -%

FIG. 6

- ✓ G00 / G01 / G02 / G03 / G79 / G8∗
  - Motions : Rapid / Linear / Circular / Cycles
- ✓ G12.1 / G13.1 — Polar mode
- ✓ G17 / G18 / G19 — Plane selection : XY / YZ / ZX
- ✓ G20(G70) / G21(G71) — Input Unit : Inch / Metric
- ✓ G28 / G29 — Return home / From home
- ✓ G50(G92) — Work coordinate reset
- ✓ G52 — Set local coordinate system
- ✓ G53 — Machine datum move
- ✓ G54 - G59 — Fixture offsets
- ✓ G90 / G91 — Absolute / Incremental mode
- ✓ G96 / G97 — Spindle speed unit: SFM(SMM) / RPM
- ✓ G98 / G99 / G93 — Feed rate mode : IPM(MMPM) / IPR(MMPR) / FRN

- ✓ M06 — Tool change
- ✓ M07 / M08 / M09 — Coolant codes
- ✓ M13 / M14 / M05 — Spindle mode : CLW / CCLW / Off
- ✓ M30 — Program stop
- ✓ % — Program rewind stop
- ✓ / — Optional block skip
- ✓ # (=) — Control variables
- ✓ Helix — via CAM Events
- ✓ NURBS — via CAM Events
- ✓ Other NC codes can also be added and handled

FORMAT COORDINATE "&_04_40"

.
    .
    .

ADDRESS X
        {
                FORMAT          COORDINATE
                FORCE           off
                MAX             9999.9999  TRUNCATE
                MIN             -9999.9999 TRUNCATE
                LEADER          X
        }

ADDRESS Y
        {
                FORMAT          COORDINATE
                FORCE           off
                MAX             9999.9999  TRUNCATE
                MIN             -9999.9999 TRUNCATE
                LEADER          Y
        }

ADDRESS Z
        {
                FORMAT          COORDINATE
                FORCE           off
                MAX             9999.9999  TRUNCATE
                MIN             -9999.9999 TRUNCATE
                LEADER          Z
        }

set mom_sim_address(X,leader)              "X"
set mom_sim_address(X,leader_len)          "1"
set mom_sim_address(X,trailer)             ""
set mom_sim_address(X,trailer_len)         "0"
set mom_sim_address(X,modal)               "1"
set mom_sim_address(X,format)              "Coordinate"

set mom_sim_address(Y,leader)              "Y"
set mom_sim_address(Y,leader_len)          "1"
set mom_sim_address(Y,trailer)             ""
set mom_sim_address(Y,trailer_len)         "0"
set mom_sim_address(Y,modal)               "1"
set mom_sim_address(Y,format)              "Coordinate"

set mom_sim_address(Z,leader)              "Z"
set mom_sim_address(Z,leader_len)          "1"
set mom_sim_address(Z,trailer)             ""
set mom_sim_address(Z,trailer_len)         "0"
set mom_sim_address(Z,modal)               "1"
set mom_sim_address(Z,format)              "Coordinate"

.
.
.

set_mom_sim_format(Coordinate,type)        "Numeral"
set_mom_sim_format(Coordinate,plus)        "0"
set_mom_sim_format(Coordinate,lead_zero)   "1"
set_mom_sim_format(Coordinate,integer)     "4"
set_mom_sim_format(Coordinate,decimal)     "0"
set_mom_sim_format(Coordinate,fraction)    "4"
set_mom_sim_format(Coordinate,trail_zero)  "1"

| | | | |
|---|---|---|---|
| MOTION RAPID | G 00 | CYCLE DRILL BREAK CHIP | G 73 |
| MOTION LINEAR | G 01 | CYCLE TAP | G 84 |
| CIRCULAR INTERPERLATION CLW | G 02 | CYCLE BORE | G 85 |
| CIRCULAR INTERPERLATION CCLW | G 03 | CYCLE BORE DRAG | G 86 |
| DELAY (SEC) | G 04 | CYCLE BORE NO DRAG | G 76 |
| DELAY (REV) | G 04 | CYCLE BORE DWELL | G 89 |
| PLANE XY | G 17 | CYCLE BORE MANUAL | G 88 |
| PLANE ZX | G 18 | CYCLE BORE BACK | G 87 |
| PLANE YZ | G 19 | CYCLE BORE MANUAL DWELL | G 88 |
| CUTCOM OFF | G 40 | ABSOLUTE MODE | G 90 |
| CUTCOM LEFT | G 41 | INCREMENTAL MODE | G 91 |
| CUTCOM RIGHT | G 42 | CYCLE RETRACT (AUTO) | G 98 |
| TOOL LENGTH ADJUST PLUS | G 43 | CYCLE RETRACT (MANUAL) | G 99 |
| TOOL LENGTH ADJUST MINUS | G 44 | RESET | G 92 |
| TOOL LENGTH ADJUST OFF | G 49 | FEEDRATE MODE IPM | G 94 |
| INCH MODE | G 70 | FEEDRATE MODE IPR | G 95 |
| METRIC MODE | G 71 | FEEDRATE MODE FRN | G 93 |
| CYCLE START CODE | G 79 | SPINDLE CSS | G 96 |
| CYCLE OFF | G 80 | SPINDLE RPM | G 97 |
| CYCLE DRILL | G 81 | RETURN HOME | G 28 |
| CYCLE DRILL DWELL | G 82 | FEEDRATE MODE MMPM | G 94 |
| CYCLE DRILL DEEP | G 83 | FEEDRATE MODE MMPR | G 95 |

| | |
|---|---|
| STOP/MANUAL TOOL CHANGE | M 00 |
| OPSTOP | M 01 |
| PROGRAM END | M 02 |
| SPINDLE ON/CLW | M 03 |
| SPINDLE CCLW | M 04 |
| SPINDLE OFF | M 05 |
| TOOL CHANGE/RETRACT | M 06 |
| COOLANT ON | M 08 |
| COOLANT FLOOD | M 19 |
| COOLANT MIST | M 07 |
| COOLANT THRU | M 26 |
| COOLANT TAP | M 27 |
| COOLANT OFF | M 09 |
| REWIND | M 30 |

FIG. 10B

```
set mom_sys_rapid_code                        "0"
set mom_sys_linear_code                       "1"
set mom_sys_circle_code(CLW)                  "2"
set mom_sys_circle_code(CCLW)                 "3"
set mom_sys_delay_code(SECONDS)               "4"
set mom_sys_delay_code(REVOLUTIONS)           "4"
set mom_sys_cutcom_plane_code(XY)             "17"
set mom_sys_cutcom_plane_code(ZX)             "18"
set mom_sys_cutcom_plane_code(XZ)             "18"
set mom_sys_cutcom_plane_code(YZ)             "19"
set mom_sys_cutcom_plane_code(ZY)             "19"
set mom_sys_cutcom_code(OFF)                  "40"
set mom_sys_cutcom_code(LEFT)                 "41"
set mom_sys_cutcom_code(RIGHT)                "42"
set mom_sys_adjust_code                       "43"
set mom_sys_adjust_code_minus                 "44"
set mom_sys_adjust_cancel_code                "49"
set mom_sys_unit_code(IN)                     "70"
set mom_sys_unit_code(MM)                     "71"
set mom_sys_cycle_start_code                  "79"
set mom_sys_cycle_off                         "80"
set mom_sys_cycle_drill_code                  "81"
set mom_sys_cycle_drill_dwell_code            "82"
set mom_sys_cycle_drill_deep_code             "83"
set mom_sys_cycle_drill_break_chip_code       "73"
set mom_sys_cycle_tap_code                    "84"
set mom_sys_cycle_bore_code                   "85"
set mom_sys_cycle_bore_drag_code              "86"
set mom_sys_cycle_bore_no_drag_code           "76"
set mom_sys_cycle_bore_dwell_code             "89"
set mom_sys_cycle_bore_manual_code            "88"
set mom_sys_cycle_bore_back_code              "87"
set mom_sys_cycle_bore_manual_dwell_code      "88"
set mom_sys_output_code(ABSOLUTE)             "90"
set mom_sys_output_code(INCREMENTAL)          "91"
set mom_sys_cycle_ret_code(AUTO)              "98"
set mom_sys_cycle_ret_code(MANUAL)            "99"
set mom_sys_reset_code                        "92"
set mom_sys_feed_rate_mode_code(IPM)          "94"
set mom_sys_feed_rate_mode_code(IPR)          "95"
set mom_sys_feed_rate_mode_code(FRN)          "93"
set mom_sys_spindle_mode_code(SFM)            "96"
set mom_sys_spindle_mode_code(RPM)            "97"
set mom_sys_return_code                       "28"
set mom_sys_program_stop_code                 "0"
set mom_sys_optional_stop_code                "1"
set mom_sys_end_of_program_code               "2"
set mom_sys_spindle_direction_code(CLW)       "3"
set mom_sys_spindle_direction_code(CCLW)      "4"
set mom_sys_spindle_direction_code(OFF)       "5"
set mom_sys_tool_change_code                  "6"
set mom_sys_coolant_code(ON)                  "8"
set mom_sys_coolant_code(FLOOD)               "8"
set mom_sys_coolant_code(MIST)                "7"
set mom_sys_coolant_code(THRU)                "26"
set mom_sys_coolant_code(TAP)                 "27"
set mom_sys_coolant_code(OFF)                 "9"
                                              "30"
```

FIG. 10C
```
set mom_sim_nc_func (CUTCOM_LEFT)              "G41"
set mom_sim_nc_func (CUTCOM_RIGHT)             "G42"
set mom_sim_nc_func (CUTCOM_OFF)               "G40"

set mom_sim_nc_func (PLANE_XY)                 "G17"
set mom_sim_nc_func (PLANE_ZX)                 "G18"
set mom_sim_nc_func (PLANE_YZ)                 "G19"

set mom_sim_nc_func (TL_ADJUST_PLUS)           "G43"
set mom_sim_nc_func (TL_ADJUST_MINUS)          "G44"
set mom_sim_nc_func (TL_ADJUST_CANCEL)         "G49"

set mom_sim_nc_func (FEED_IPM)                 "G94"
set mom_sim_nc_func (FEED_IPR)                 "G95"
set mom_sim_nc_func (FEED_MMPM)                "G94"
set mom_sim_nc_func (FEED_MMPR)                "G95"
set mom_sim_nc_func (FEED_FRN)                 "G93"

set mom_sim_nc_func (SPEED_SFM)                "G96"
set mom_sim_nc_func (SPEED_SMM)                "G96"
set mom_sim_nc_func (SPEED_RPM)                "G97"

set mom_sim_nc_func (CYCLE_RETURN_AUTO)        "G98"
set mom_sim_nc_func (CYCLE_RETURN_MANUAL)      "G99"

set mom_sim_nc_func (MOTION_RAPID)             "G00"
set mom_sim_nc_func (MOTION_LINEAR)            "G01"
set mom_sim_nc_func (MOTION_CIRCULAR_CLW)      "G02"
set mom_sim_nc_func (MOTION_CIRCULAR_CCLW)     "G03"
set mom_sim_nc_func (CYCLE_DRILL)              "G81"
set mom_sim_nc_func (CYCLE_DRILL_DWELL)        "G82"
set mom_sim_nc_func (CYCLE_DRILL_DEEP)         "G83"
set mom_sim_nc_func (CYCLE_DRILL_BREAK_CHIP)   "G73"
set mom_sim_nc_func (CYCLE_TAP)                "G84"
set mom_sim_nc_func (CYCLE_BORE)               "G85"
set mom_sim_nc_func (CYCLE_BORE_DRAG)          "G86"
set mom_sim_nc_func (CYCLE_BORE_NO_DRAG)       "G76"
set mom_sim_nc_func (CYCLE_BORE_BACK)          "G87"
set mom_sim_nc_func (CYCLE_BORE_MANUAL)        "G88"
set mom_sim_nc_func (CYCLE_BORE_DWELL)         "G89"
set mom_sim_nc_func (CYCLE_BORE_MANUAL_DWELL)  "G88"
set mom_sim_nc_func (CYCLE_START)              "G79"
set mom_sim_nc_func (CYCLE_OFF)                "G80"

set mom_sim_nc_func (INPUT_ABS)                "G90"
set mom_sim_nc_func (INPUT_INC)                "G91"

set mom_sim_nc_func (DELAY_SEC)                "G04"
set mom_sim_nc_func (DELAY_REV)                "G04"
set mom_sim_nc_func (WORK_CS_RESET)            "G92"
set mom_sim_nc_func (RETURN_HOME)              "G28"
set mom_sim_nc_func (UNIT_IN)                  "G70"
set mom_sim_nc_func (UNIT_MM)                  "G71"

set mom_sim_nc_func (SPINDLE_CLW)              "M03"
set mom_sim_nc_func (SPINDLE_CCLW)             "M04"
set mom_sim_nc_func (SPINDLE_OFF)              "M05"

set mom_sim_nc_func (COOLANT_ON)               "M08"
set mom_sim_nc_func (COOLANT_FLOOD)            "M08"
set mom_sim_nc_func (COOLANT_MIST)             "M07"
set mom_sim_nc_func (COOLANT_THRU)             "M26"
set mom_sim_nc_func (COOLANT_TAP)              "M27"
set mom_sim_nc_func (COOLANT_OFF)              "M09"

set mom_sim_nc_func (PROG_STOP)                "M00"
set mom_sim_nc_func (PROG_OPSTOP)              "M01"
set mom_sim_nc_func (PROG_END)                 "M02"
set mom_sim_nc_func (TOOL_CHANGE)              "M06"
set mom_sim_nc_func                            "M30"
```

1100

SYSTEM AND METHOD FOR CONSTRUCTING VIRTUAL NC CONTROLLERS FOR MACHINE TOOL SIMULATION

CROSS-REFERENCE TO OTHER APPLICATION

This application claims priority from U.S. Provisional Patent Application 61/075,900, filed Jun. 26, 2008, which is hereby incorporated by reference.

TECHNICAL FIELD

The present disclosure is directed, in general, to computer aided design and manufacturing.

BACKGROUND OF THE DISCLOSURE

Numerically controlled (NC) machining is a fundamental manufacturing process for the fabrication of mechanical parts. With the advances of computer technology and the sophistication of software systems, more complex shapes and forms of the components have been designed for an ever increasing range of applications. To satisfy the demands of geometric complexity and other requirements, a Computer Aided Manufacturing (CAM) software system has become a necessary link and crucial element in the life cycle of any product.

SUMMARY OF THE DISCLOSURE

Disclosed embodiments include a system, method, and computer program product for creating a virtual numerical control (NC) controller for use in machine tool simulation. An exemplary method includes receiving a NC program readable by a physical machine tool, the NC program containing instructions for manipulating the physical machine tool. The method also includes parsing the instructions in the NC program. The method further includes receiving setup data in a setup data file. The method still further includes translating each instruction in the NC program into at least one virtual NC controller command. The method also includes executing the virtual NC controller commands in a machine tool simulation.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIGS. 5A and 5B depict several tokens of NC instructions that are analyzed by the VNC parser, according to certain embodiments;

FIG. 6 lists the NC tokens that are recognized and processed by the VNC parser by default, according to certain embodiments;

FIG. 9A depicts an excerpt of a definition file for a post processor of one embodiment;

FIG. 9B depicts a corresponding transcript in a VNC file, according to one embodiment;

FIG. 10A depicts typical G and M codes for one embodiment of a FANUC™ style controller;

FIG. 10B depicts examples of Tcl variables for preparatory functions in post-processor code;

FIG. 10C depicts example preparatory functions in a VNC file;

DETAILED DESCRIPTION

Figure 1:
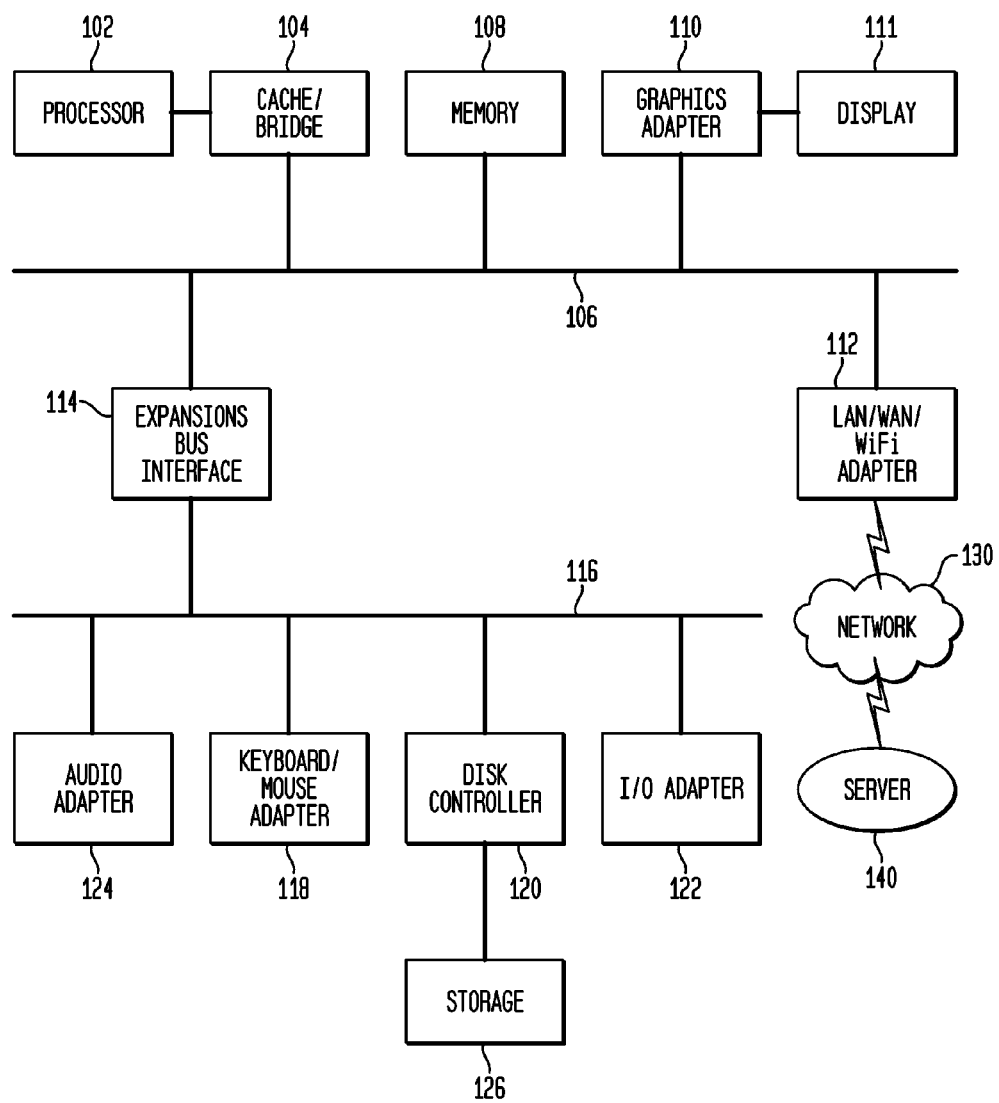
FIG. 1 depicts a block diagram of a data processing system in which an embodiment of the disclosed system can be implemented.

FIGS. 1 through 13, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

A primary goal for those who employ a CAM system is to be able to utilize the information within the tool paths to eventually control a real machine tool and fabricate the real parts. Modern machine tools controlled by digital computers, known as NC machine tools, require a properly formulated instruction set, called an NC program, to guide the cutting tools along the desired paths and thereby produce parts in the desired shape and size.

Due to a wide diversity of controllers in the market, the instruction sets used to drive the controllers also may vary significantly. For a CAM system to support a large number of machine tools and their controllers, a software application known as a post-processor is utilized to transform the information of tool paths into instructions in a particular format that can then be understood by the desired controller of a machine.

The benefit of being able to verify a NC program before its deployment onto a real machine is apparent. NC program verification and machine tool simulation help to ensure that an NC program is to be used with confidence in the shop floor. They are also important in guaranteeing the exactness of the tool paths and the parts being produced. For complex multi-function machines, such as mill-turn production centers or Swiss-lathe style machines with multi-spindles and/or multi-turrets in the hardware configuration, the NC program verification and machine tool simulation are important.

Most existing machine-tool simulation systems simply play back the internally generated tool path data in a virtual machine tool environment. This approach may not account for the NC codes that may have been introduced by the post-processor or augmented by other sources during post-processing. Thus, it would be preferable to perform tool path verification and simulation using the actual NC codes that will eventually be fed to the machine's controller. Simulation performed by mimicking the behavior of a real controller equipped with the machine of interest achieves a close-to-reality confidence level.

A software module, called a virtual NC controller, can interpret the NC codes in the program and translate the instructions into commands that direct a virtual machine tool and thus shape the virtual parts into the desired geometry. The virtual NC controller (or VNC) acts like the controller of a machine tool in the real world, negotiating between the NC instructions and the movements of the machine's components, but in a virtual environment.

To address the wide variety of controllers and machine configurations, a system, method, and computer program product that are able to efficiently produce a virtual NC controller are introduced herein. Such a system and method can be used in conjunction with post-processor systems, such as the Post Builder product provided with NX® by Siemens Product Lifecycle Management Software Inc., and with machine tool simulation systems, such as the ISV (Integrated Simulation & Verification) product, also by Siemens Product Lifecycle Management Software Inc. The virtual NC controller system disclosed herein practically eliminates all the duplication and possible human error encountered in conventional systems. This enables users to produce and verify NC programs more effectively thus enhance their productivity.

A virtual NC controller created with the described system is able to take advantage of access to the information of a CAM object's data such as machine kinematics, cutting tools and reference coordinate systems. This scheme enables the virtual NC controller to adapt and respond according to the changes of a CAM program and yield proper simulation. As an added benefit, a virtual NC controller created with the described system can also be easily set up to simulate external NC programs that may have been produced by other CAM systems.

FIG. 1 depicts a block diagram of a data processing system in which an embodiment of the disclosed system can be implemented. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, track pointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Figure 2:
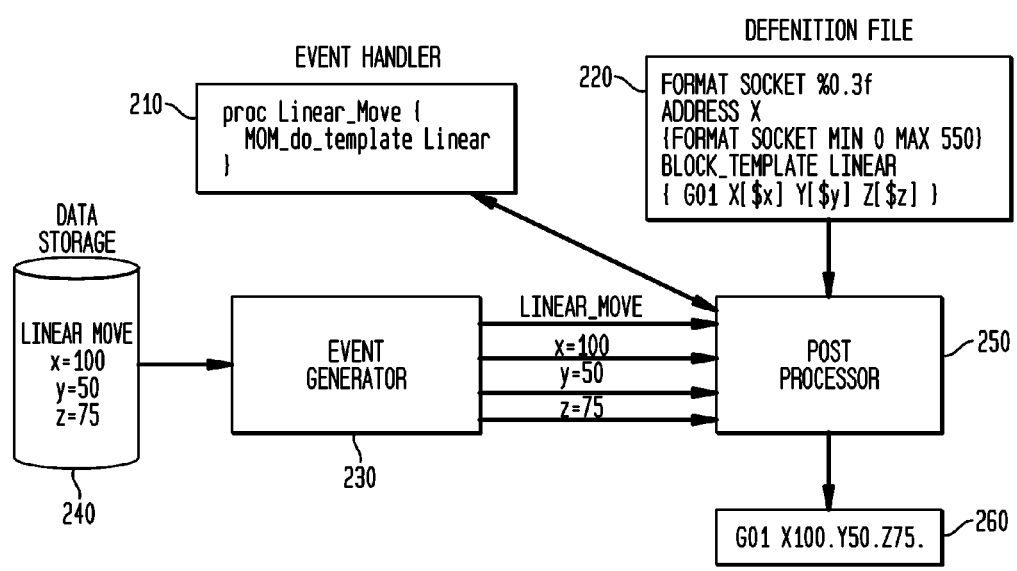
FIG. 2 depicts a post-processor module as used in CAM systems, according to certain embodiments of the present disclosure.

FIG. 2 depicts a post-processor module as used in CAM systems, according to certain embodiments of the present disclosure. Post-processor module 200 includes an Event Handler file 210 and a Definition file 220. Definition file 220 defines how the NC instructions are to be formatted and output. Typically, definition files are written using a special proprietary vocabulary of the CAM system.

Event Handler file 210 is composed of a set of Tcl commands called event handlers. While Event Handler file 210 is written in Tcl scripting language, it is contemplated that other scripting or programming languages may be used. An event handler (not shown) is responsible for management of the events that occur in a tool path. In certain embodiments, a tool path generated in a CAM system is defined in terms of a sequence of events such as motion events, tool change events, and other control events. Each event carries a set of internally defined data. Event Handler file 210 depicts data for a linear move event in the example in FIG. 2. There is one designated event handler for each event.

During post-processing, the Event Generator module 230 will take raw tool path data 240 from each event and transform the data 240 into Tcl variables. These variables will then be formatted by post-processor engine 250 into the desired NC codes 260. The designated event handler is invoked to manipulate the data resulting from the event.

A key element in the implementation of the post-processor mechanism of some embodiments is that every NC block goes through a process MOM_before_output before it is written out to a file. The MOM (Manufacturing Output Manager) module is responsible for managing and producing outputs derived from CAM objects. The MOM module is employed in various applications in CAM. In some embodiments, the post-processor module is built upon the MOM architecture. Using the MOM_before_output command as a delimiter, each NC block, instead of being directed to an output file, can be intercepted and then translated into instructions for animating the components of a virtual machine tool assembly.

Figures 3, 4:
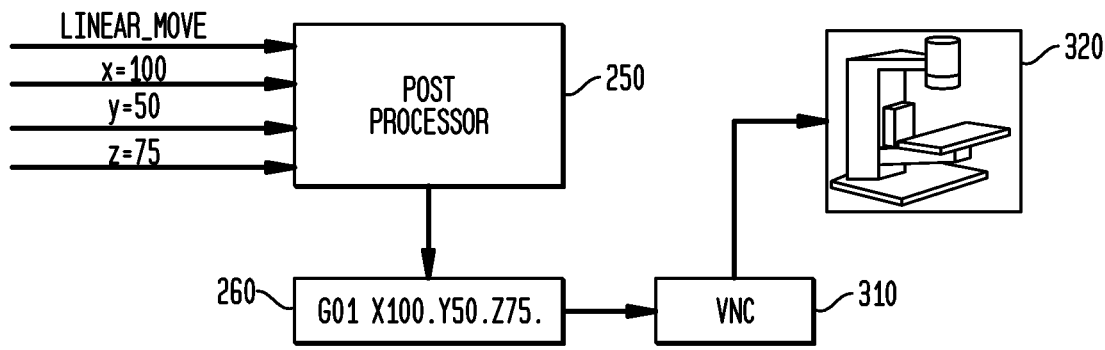
FIG. 3 depicts a flow of NC instructions to a virtual NC controller for machine tool simulation, according to one embodiment of the present disclosure.
FIG. 4 depicts a portion of a NC program formatted for a FANUC™ style controller, according to one embodiment of the present disclosure.

FIG. 3 depicts a flow of NC instructions to a virtual NC controller (VNC) for machine tool simulation, according to one embodiment of the present disclosure. In the system 300 shown, Tcl variables, such as those from Event Generator module 230 are formatted by post-processor engine 250 into NC codes 260, as described with respect to FIG. 2. The VNC 310 receives NC codes 260 and translates the codes into VNC commands. The commands, when executed, cause movements of a virtual machine tool assembly in a graphical simulator environment 320. During simulation in some embodiments, a post-processor of a CAM system (e.g., post-processor engine 250) and a virtual NC controller (e.g., VNC 310) work in concert; the former creates NC codes and the latter interprets the instructions and converts them to the simulation commands that are used by the CAM system to animate the solid components of a virtual machine tool assembly.

Rather than creating simulation commands based on the motion and other events of the tool paths, the system and method disclosed herein are based on post-processed NC codes that are processed by the VNC parser independent of the events. This approach provides several benefits. First, the dependency between a post-processor and its simulation driver (VNC) is substantially reduced. Second, minimal add-in code is introduced to a regular post-processor to enable the simulation. Third, an NC code-based approach allow for independent development of a post-processor and a corresponding VNC. Fourth, the same VNC can be used to simulate externally developed NC programs.

The system and method described herein facilitate the functionalities of machine tool simulation in a CAM system. The system provides an effective methodology for constructing the virtual NC controllers that can be used to perform machine tool simulation in the CAM system.

FIG. 4 depicts a portion of a NC program for a controller using FANUC™ style NC codes, according to one embodiment of the present disclosure. FANUC is a robotics technology company headquartered in Japan. However, it should be clear to those skilled in the art that the disclosed system can accommodate other families of controllers. NC code fragment 400 will be used below to explain how the VNC parses and translates the NC instructions into procedures for machine tool simulation.

In certain embodiments, when a NC program is subject to simulation, the VNC will consider the numbers followed by the addresses (or registers) of the NC axes—X, Y, Z, B and C. In order for the VNC to interpret the numbers, the VNC determines the answers to at least these three questions:

1. Are these numbers absolute or incremental?
2. What is the unit of measurement specified? Inch, centimeter, or other?
3. What reference coordinate system do the numbers respect?

The answers can be derived from the NC codes. Consider, for example, the first NC code block found in NC code fragment 400 in FIG. 4: N0010 G40 G17 G90 G70. The first value, "N0010", is simply the block number. "G90" indicates that the subsequent numbers in the program will be "absolute" (until changed otherwise). "G70" indicates that the measuring unit for the numbers is "inch".

If the next two blocks in NC code fragment 400 are ignored for now, the next block to consider is: N0040 G54. Once again, the first value, "N0040", is simply the block number. "G54" indicates that the subsequent numbers are measured with respect to a coordinate system that has been configured with the machine tool. With all three pieces of information in place, the next NC code block of NC code fragment 400 can be correctly interpreted: N0050 G00 G90 X10.431 Y3.249 B0.0 S0 M03. Based on the interpretation of the earlier blocks, N0010 and N0040, the meaning of "X10.431" and "Y3.249" in this block can be correctly interpreted as absolute coordinates, measured in inches, with respect to a coordinate system configured with the machine tool. It is noted that a "G90" code has been repeated here, which reinforces the "absolute" mode.

As seen in this example, by knowing the code specifications of a post-processor, a VNC parser can correctly interpret the NC codes that the post-processor generates. FIGS. 5A and 5B depict several tokens of NC instructions that are analyzed by the VNC parser, according to certain embodiments. FIG. 6 lists the NC tokens that are recognized and processed by the VNC parser by default, according to certain embodiments.

Figure 7:
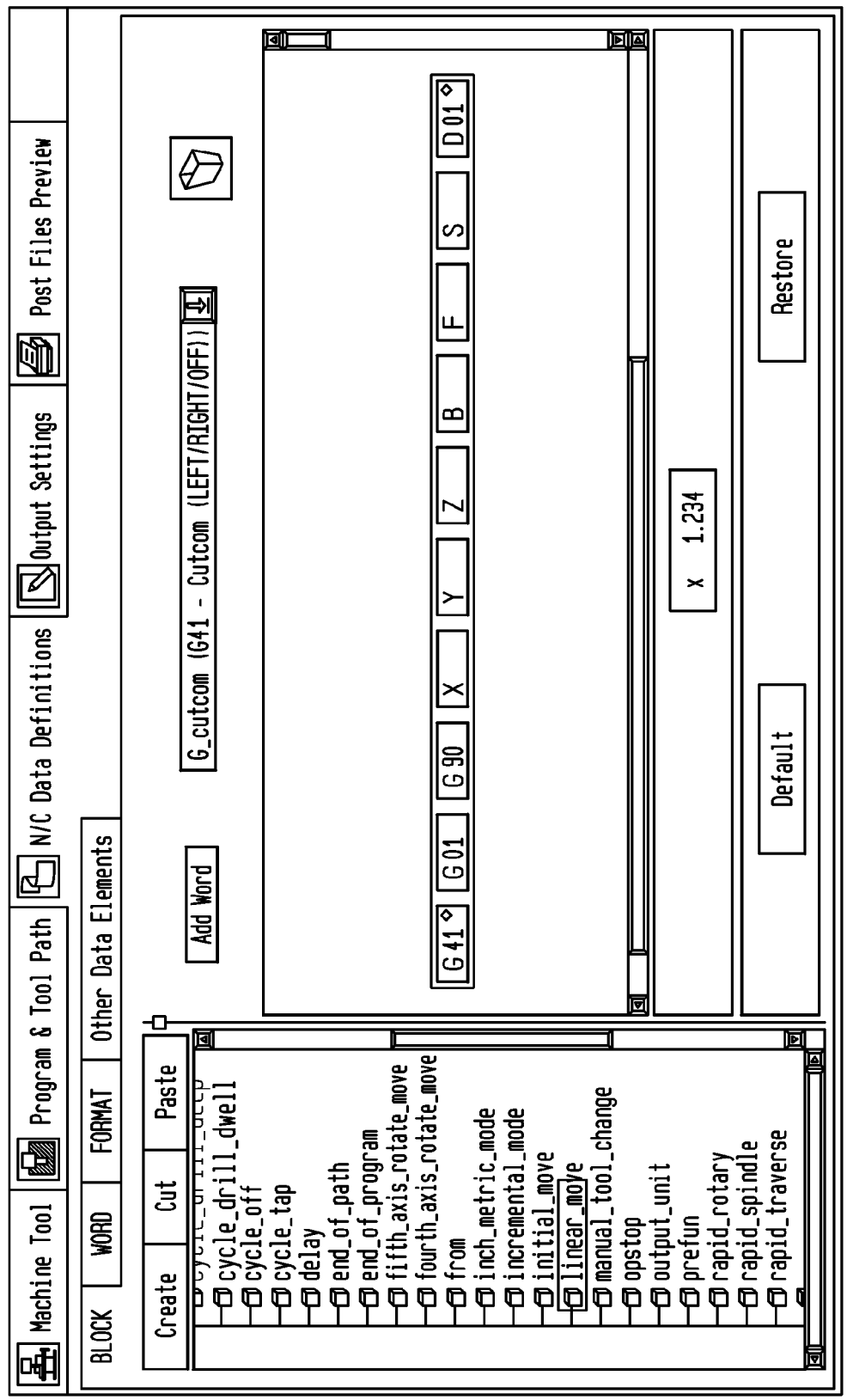
FIG. 7 depicts a user interface for a Block Template for a linear move in one embodiment of a post processor.

In certain embodiments of CAM systems, a Block Template is the main template used to define how NC blocks for different events are output. FIG. 7 depicts a user interface for a Block Template for a linear move in one embodiment of a post processor. Block Template 700 is composed of a cluster of Words (sometimes called NC tokens). In certain embodiments, a Word is defined by an Address and an expression that contains the variables and constants to be output at the runtime of post-processing. An example of an output variable is "$mom_pos(0)".

Figure 8:
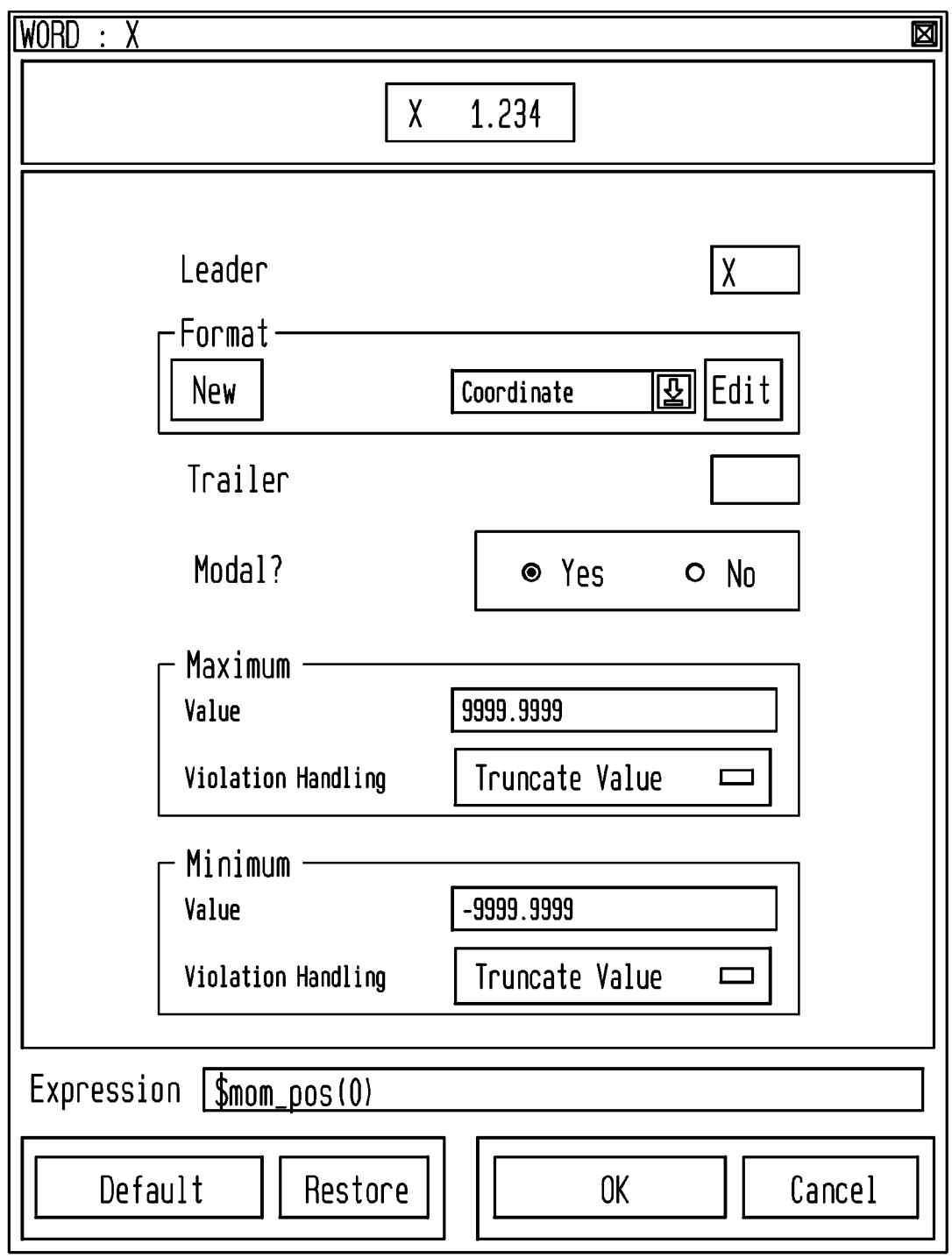
FIG. 8 depicts parameters that may be specified for an Address in some embodiments.

FIG. 8 depicts several parameters that may be specified for an Address in some embodiments. These parameters may include Leader, Format, Trailer, Modality, Maximum, Minimum, and Expression. For example, the value of the Expression "$mom_pos(0)" may be determined at the runtime of the post-processor. The format will determine how the value will be presented.

Format can be defined and used to output numeric data or text strings (depending on data type). Numeric data can be arranged into various formats as required by the controller in question. For example, in certain embodiments, an intrinsic value of "1.234" can be output as "+1.234", "001.2340", "00012340", or otherwise, depending on the controller. When numeric data is output without a decimal point, the VNC parser relies on the attributes of the Format associated with the Address to interpret the true value of the number in question. Thus, the attributes of the Format used by each Address are, in many embodiments, important information to be conveyed from a post processor to the VNC.

FIG. 9A depicts an excerpt of a definition file for a post processor of one embodiment. FIG. 9B depicts a corresponding transcript in the VNC file, according to one embodiment. FIGS. 9A and 9B thus provide a comparison between files of a post processor and a virtual controller. In the examples of FIGS. 9A and 9B, the X, Y and Z addresses are output using the Format "Coordinate", where the decimal point is suppressed and both leading and trailing zeros are present. The file excerpt of FIG. 9B enables the VNC parser to correctly interpret "00012340" into the correct value of "1.234".

In certain embodiments, when composing a post-processor, the user first needs to specify certain preparatory functions and miscellaneous functions. For FANUC™ style controllers, these functions are known as G and M codes. FIG. 10A depicts tables of typical G and M codes for one embodiment of a FANUC™ style controller. Codes displayed on the tables in FIG. 10A have been formatted per the controller's requirements, using a combination of the Address and Format parameters described above. The information may be saved into the post-processor as Tcl variables, as shown in the example in FIG. 10B. When the user chose to enable the simulation capability for the post-processor in progress, these functions will be conveyed and saved to the VNC file, as shown in the example in FIG. 10C. The functions shown in FIG. 10C enable the VNC parser to understand the NC instructions, such as "absolute" versus "incremental" or "inch" versus "metric", among other functions in the program.

In many embodiments, tool and coordinate system are used for machine tool simulation. For example, looking again at the NC code fragment 400 in FIG. 4, the VNC parser needs to know what tool that the code "T04" (found in block number 0030) represents in order to display the cutting tool; it also needs to know what coordinate system is represented by the code "G54" (in block number N0040) in order to interpret the coordinates values correctly and guide the tool to the proper location. However, data for these objects is often not defined in the post-processor, and therefore, is not conveyed to the VNC. These objects can be specified in the CAM program that is subject to simulation and thus data can be passed to the VNC parser at runtime.

To convey information from CAM objects to the VNC processor, certain procedures can be executed in the event handlers of a post-processor for the events of interest. These procedures are defined in the associated VNC. As an example, consider the following two events: a Tool Change event and a Coordinate System Change event. A Tool Change event is triggered and handled when the need for a new tool occurs. Similarly, a Coordinate System Change event is triggered and handled when the definition of the reference coordinate system has changed, such as when an operation has been defined under a different coordinate system object.

Many existing NC controllers accept innocuous information, called operator messages, embedded in a NC program, the main purpose of which is to inform the machine operators to be aware of or to perform certain tasks such as reminders of tools to be used or how to set up the work piece. Operator messages may contain tool information, i.e. (VNC_MSG:: TOOL_NAME==UGTI0201_068), reference coordinate systems and other objects of interest. Messages of this sort typically do not cause any effect on the real machine tool. Usually, operator messages are prefixed by a "control-out" symbol and/or suffixed by "control-in" symbol that notify the controller to ignore the instructions enclosed by the symbols. In advantageous embodiments, the VNC parser interprets the operator messages, passed from the post-processor, upon encountering the "control-out" and "control-in" symbols. This approach enables the tool data, reference coordinate systems and other information of interest to be conveyed from the CAM objects to the VNC processor during simulation In certain advantageous embodiments, the VNC is also capable of simulating externally generated NC programs that result from previously post-processed jobs by other third party post-processing systems. When such a NC program is subject to simulation, no CAM program, operations or tool paths are involved; neither post-processing nor event handling will be running. The information of tools and coordinate systems that can be dynamically obtained from the CAM objects for simulation at runtime, as described earlier, will not be available. These missing pieces of information are collectively referred as setup data or program definition data. The VNC described herein enables users to specify the setup data in a text file containing procedures such as Tcl procedures. A setup data file can be associated with a specific NC program. The file will then be sourced and processed by the VNC parser. In certain embodiments, a setup data file and a NC program may be associated by file names. For example, NC program "P1234.ptp" will cause setup data file "P1234_setup.tcl" to be processed automatically.

Figure 11:
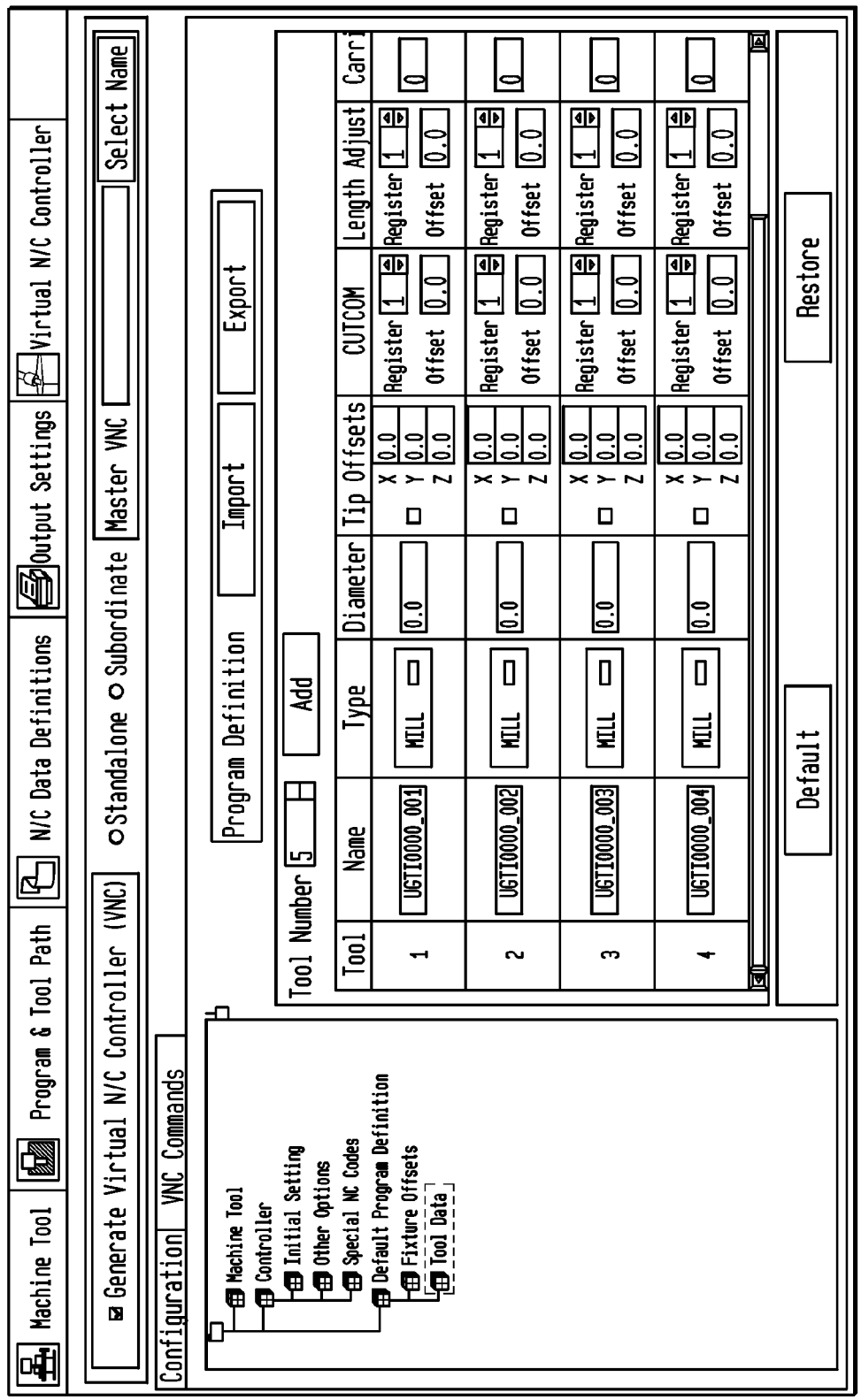
FIG. 11 depicts a graphical image of a setup tool that is included with one embodiment of a VNC.

FIG. 11 depicts a graphical image of a setup tool that is included with one embodiment of the VNC. Setup tool 1100 allows a user to create a setup data file to be saved with the VNC as the default settings. Setup tool 1100 can be used when no individual setup data file is provided for a NC program that is subject to simulation. Setup tool 1100 includes an "Export" function to create setup data files for any known NC programs. Setup tool 1100 also includes an "Import" function that allows the users to import and modify existing setup data files.

NC instructions used by many families of controllers deviate from that of the default FANUC™ style. For example, certain non-FANUC™ codes cause movements without the need of coordinates information. Other codes cause movements in conjunction with different coordinates systems. This issue is addressed in certain embodiments of the VNC by allowing the users to add simulation handlers for any NC tokens in question. The user will construct a VNC command for any token that requires special attention.

In certain embodiments, a variety of VNC utility commands may be available to the VNC. Representative commands include:

VNC_parse_nc_word—This command can be used to extract or identify tokens in a NC block buffer.

VNC_extract_address_val—This command can be used to extract the value of an Address in a NC block buffer. This command returns a true value, instead of the formatted NC code carried by the variable mom_sim_nc_code.

VNC_parse_motion_word—This command can be used to update a coordinate's information in the variable mom_sim_pos. It may be necessary to back up the coordinate's information before executing this command.

Other VNC commands may be added in some embodiments of a post-processor to facilitate simulation. Such commands may be prefixed with PB_CMD_vnc_. The commands described above are for example purposes only. Other commands may be available in certain embodiments.

Figure 12:
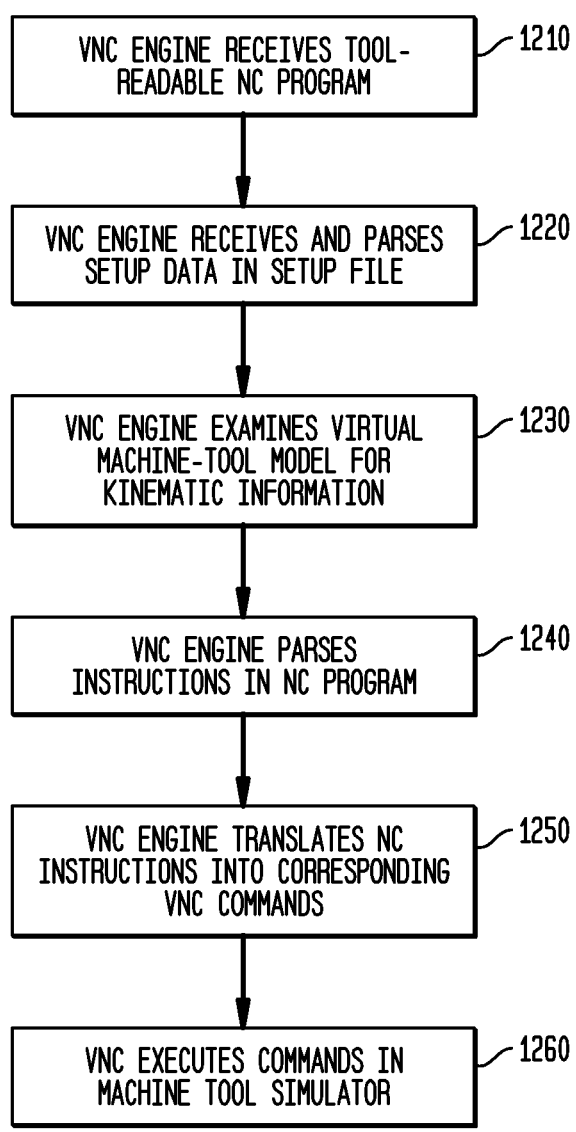
FIG. 12 depicts a process for creating a virtual NC controller, such as VNC 310, according to one embodiment of the present disclosure.

FIG. 12 depicts a process for creating a virtual NC controller, such as VNC 310, according to one embodiment of the present disclosure. First, a VNC processor receives an NC program that is readable by a physical machine tool (step 1210). The NC program contains instructions for manipulating the physical machine tool. Next, the VNC processor receives and parses setup data in a setup data file (step 1220). Next, the VNC processor examines the virtual machine-tool model for kinematic information, such as the number of NC axes, axis names (e.g., X, Y, Z, B, C), axis limits, tool mounting location and orientation, and part mounting location and orientation and so on (step 1230). For complex machines, additional kinetic information may be determined.

In the next step, the VNC processor parses the instructions in the NC program by searching for occurrences of delimiter commands (step 1240). Once the instructions are parsed, the VNC processor removes unnecessary instructions, like operator messages. Next, the VNC processor translates each instruction in the NC program into at least one VNC command (step 1250). Finally, the VNC commands are executed in a machine tool simulator to cause movement of a virtual machine tool (step 1260).

Figure 13:
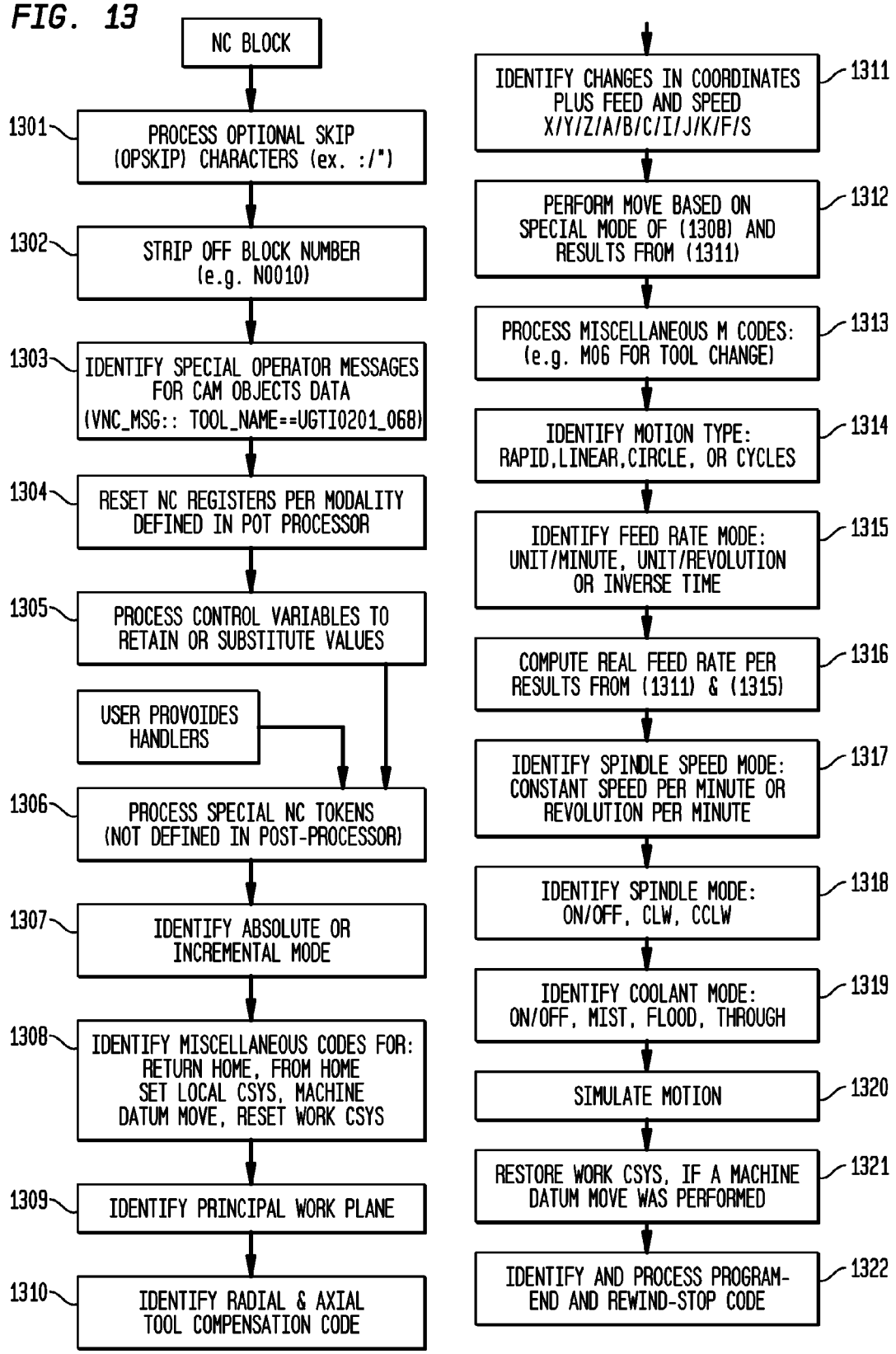
FIG. 13 depicts a process in additional detail for a VNC processor to create a VNC program, according to one embodiment of the present disclosure.

FIG. 13 depicts a process in additional detail for a VNC processor to create a VNC program, according to one embodiment of the present disclosure. First, the VNC processor processes optional skip characters (e.g., a "/" character) that may be present in the NC program block (step 1301). Next, the VNC processor strips off the block number of the program block (e.g., N0010) (step 1302). Next, the VNC processor identifies special operator messages for any CAM object data (step 1303). An example of a special operator message is:

(VNC_MSG:: TOOL_NAME=UGTI0201_068).

Next, the VNC processor resets the NC registers per their modality as defined in the post-processor (step 1304). Next, the VNC processor processes control variables to retain or substitute values (step 1305). Next, the VNC processor processes any special NC tokens that were not defined in the post-processor (step 1306). Next, the VNC processor determines if the numerical measurement values are indicated as absolute or incremental values (step 1307). Next, the VNC processor identifies miscellaneous codes for the following commands: Return Home, From Home, Set Local CSYS (coordinate system), Machine Datum Move, and Reset Work CSYS (step 1308). Next, the VNC processor identifies the principal work plane (step 1309). Next, the VNC processor identifies the radial and axial tool compensation codes (step 1310). Next, the VNC processor identifies the changes in coordinates, circle definition, the feed rate and spindle speed (step 1311). These are identified in the NC program by the code letters X, Y, Z, A, B, C, I, J, K, F and S.

Next, the VNC processor performs a tool move, according to the special mode identified in step 1308 along with the values determined in step 1311 (step 1312). Next, the VNC processor processes any miscellaneous M codes (e.g., M06 for a tool change) (step 1313). Next, the VNC processor identifies the current motion type (e.g., rapid, linear, circle, or cycles) (step 1314). Next, the VNC processor identifies the feed rate mode (e.g., units per minute, units per revolution, or inverse time) (step 1315). Next, the VNC processor computes the real feed rate based on the results of steps 1311 and 1315 (step 1316). Next, the VNC processor identifies the spindle speed mode for the tool (e.g., constant speed per minute or revolutions per minute) (step 1317). Next, the VNC processor identifies the spindle mode for the tool (e.g., on/off, clockwise, or counter-clockwise) (step 1318).

Next, the VNC processor identifies the coolant mode for the tool (e.g., on/off, mist, flood, or through) (step 1319). Next, the VNC processor simulates the motion of the tool in the machine tool simulator (step 1320). After simulation, the VNC processor restores the work coordinate system if a machine datum was performed (step 1321). Finally, the VNC processor identifies and processes the program-end and rewind-stop codes (step 1322).

In some embodiments of the present disclosure, the module that actually performs the graphical rendering and animation of solid components is called a "SIM engine." In some embodiments, the SIM engine may be part of the machine tool simulation system, as it is in the ISV product. The VNC processor issues SIM commands from the VNC commands after the parser collects, identifies and processes information from the NC codes and carries out necessary computation of the data.

It will be apparent to those skilled in the art that the processes described above are for example purposes and should be construed to limit the disclosure in any way. The processes can be modified in other embodiments by adding steps, repeating steps, or removing certain steps, as discussed below. Also, while the exemplary processes are performed in a particular VNC environment, it should be apparent that the processes could be performed in other environments.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of a instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for creating a virtual numerical control (NC) controller to be used in a data processing system for machine tool simulation, the method comprising:
    receiving, in the data processing system, a NC program readable by a physical machine tool, the NC program containing instructions for manipulating the physical machine tool;
    parsing, by the data processing system, the instructions in the NC program by searching for occurrences of delimiter commands that cause code blocks of the NC program to be intercepted and translated;
    examining a virtual machine tool model for kinematic information that includes at least one of a number of NC axes, an axis name, an axis limit, a tool mounting location, a tool mounting orientation, a part mounting location, or a part mounting orientation;
    translating, by the data processing system, each instruction in the NC program into at least one virtual NC controller command; and
    executing, by the data processing system, the at least one virtual NC controller command in a machine tool simulation to cause movement of the virtual machine tool.

2. The method of claim 1, wherein the instructions are parsed by searching for a predetermined delimiter command after each instruction.

3. The method of claim 1, wherein translating each instruction comprises determining a coordinate system and a unit of measure for each instruction.

4. The method of claim 1, wherein translating each instruction comprises removing unnecessary instructions.

5. The method of claim 1, further comprising:
    receiving and parsing setup data in a setup data file, wherein the setup data file is associated with the NC program and the setup data includes information of tools and coordinate systems to be used in the simulation.

6. The method of claim 5, further comprising:
    providing a setup tool, the setup tool configured to allow a user to create the setup data file.

7. The method of claim 1, wherein translating each instruction comprises arranging numerical values into a usable format according to parameters in the NC program.

8. The method of claim 1, further comprising:
    fetching data from a post-processor for the physical machine tool, the fetched data not available in the NC program.

9. A data processing system comprising a processor and an accessible memory, the data processing system configured for creating a virtual numerical control (NC) controller for use in machine tool simulation by performing the steps of:
    receiving a NC program readable by a physical machine tool, the NC program containing instructions for manipulating the physical machine tool;
    parsing the instructions in the NC program;
    examining a virtual machine tool model for kinematic information that includes at least one of a number of NC axes, an axis name, an axis limit, a tool mounting location, a tool mounting orientation, a part mounting location, or a part mounting orientation;
    translating each instruction in the NC program into at least one virtual NC controller command; and
    executing the at least one virtual NC controller command in a machine tool simulation to cause movement of the virtual machine tool.

10. The data processing system of claim 9, wherein the instructions are parsed by searching for a predetermined delimiter command after each instruction.

11. The data processing system of claim 9, wherein translating each instruction comprises determining a coordinate system and a unit of measure for each instruction.

12. The data processing system of claim 9, further comprising:
    receiving and parsing setup data in a setup data file, wherein the setup data file is associated with the NC program and the setup data includes information of tools and coordinate systems to be used in the simulation.

13. The data processing system of claim 12, further comprising:
    providing a setup tool, the setup tool configured to allow a user to create the setup data file.

14. The data processing system of claim 9, wherein translating each instruction comprises arranging numerical values into a usable format according to parameters in the NC program.

15. A computer program product for creating a virtual numerical control (NC) controller for use in machine tool simulation, the computer program product comprising a non-transitory storage medium encoded with computer-executable instructions that when executed cause a data processing system to perform the steps of:
    receiving a NC program readable by a physical machine tool, the NC program containing instructions for manipulating the physical machine tool;
    parsing the instructions in the NC program;
    examining a virtual machine tool model for kinematic information that includes at least one of a number of NC axes, an axis name, an axis limit, a tool mounting location, a tool mounting orientation, a part mounting location, or a part mounting orientation;
    translating each instruction in the NC program into at least one virtual NC controller command; and
    executing the at least one virtual NC controller command in a machine tool simulation to cause movement of the virtual machine tool.

16. The computer program product of claim 15, wherein the instructions are parsed by searching for a predetermined delimiter command after each instruction.

17. The computer program product of claim 15, wherein translating each instruction comprises determining a coordinate system and a unit of measure for each instruction.

18. The computer program product of claim 15, further comprising:
    receiving and parsing setup data in a setup data file, wherein the setup data file is associated with the NC program and the setup data includes information of tools and coordinate systems to be used in the simulation.

19. The computer program product of claim 18, further comprising:
    providing a setup tool, the setup tool configured to allow a user to create the setup data file.

20. The computer program product of claim 15, wherein translating each instruction comprises arranging numerical values into a usable format according to parameters in the NC program.

\* \* \* \* \*